(12) United States Patent
Sakuyama et al.

(10) Patent No.: US 6,873,056 B2
(45) Date of Patent: Mar. 29, 2005

(54) ELECTRODE-TO-ELECTRODE BOND STRUCTURE

(75) Inventors: Seiki Sakuyama, Kawasaki (JP); Nobuhiro Imaizumi, Kawasaki (JP); Tomohisa Yagi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/704,553

(22) Filed: Nov. 12, 2003

(65) Prior Publication Data

US 2004/0106232 A1 Jun. 3, 2004

Related U.S. Application Data

(62) Division of application No. 10/124,268, filed on Apr. 18, 2002, now Pat. No. 6,670,264.

(30) Foreign Application Priority Data

Oct. 29, 2001 (JP) ........................................ 2001-331122
Mar. 11, 2002 (JP) .......................................... 2002-65894

(51) Int. Cl.⁷ ......................... H01L 23/48; H01L 23/52; H01L 29/40
(52) U.S. Cl. ..................... 257/775; 257/773; 257/779
(58) Field of Search ............................... 257/779, 785, 257/780, 773, 775

(56) References Cited

U.S. PATENT DOCUMENTS 5,473,120 A    12/1995  Ito et al.
5,492,863 A    2/1996   Higgins, III
5,874,780 A  * 2/1999   Murakami .................. 257/775
6,369,871 B1   4/2002   Hanada et al.
2001/0026015 A1 * 10/2001 Ikegami et al. ............. 257/701

FOREIGN PATENT DOCUMENTS

| JP | 02-096343 | 4/1990 |
|---|---|---|
| JP | 04-326747 | 11/1992 |
| JP | 05-326628 | 12/1993 |
| JP | 06-262386 | 9/1994 |
| JP | 08-064639 | 3/1996 |
| JP | 09-260059 | 10/1997 |
| JP | 11-135552 | 5/1999 |
| JP | 11-191673 | 7/1999 |

* cited by examiner

*Primary Examiner*—Brad Smith
(74) *Attorney, Agent, or Firm*—Westerman, Hattori, Daniels & Adrian, LLP

(57) ABSTRACT

A process of making an electrode-to-electrode bond structure includes a step of forming a resin coating on a first bonding object having a first electrode portion in a manner such that the resin coating covers the first electrode portion. Then, an opening is formed in the resin coating to expose the first electrode portion. Then, the opening is filled with a metal paste containing a metal and a resin component. Then, the first bonding object is placed on a second bonding object having a second electrode portion in a manner such that the metal paste filled in the opening faces the second electrode portion while the resin coating contacts the second bonding object. Finally, heat-treatment is performed to cause the first electrode portion and the second electrode portion to be electrically connected with each other via the metal while causing the resin coating to harden.

3 Claims, 7 Drawing Sheets

ELECTRODE-TO-ELECTRODE BOND STRUCTURE

This application is a divisional application of prior application Ser. No. 10/124,268 filed on Apr. 18, 2002 which is now U.S. Pat. No. 6,670,264, issued on Dec. 30, 2003.

BACKGROUND OF THE INVENTION

1. Field of the Invention

The present invention relates to a process of forming an electrode-to-electrode bond structure. More specifically, the present invention relates to a process of forming an electrode-to-electrode bond structure which can be applied to e.g. bonding as well as electrically connecting a semiconductor chip to another semiconductor chip, mounting a semiconductor chip on a wiring board, and connecting a wiring board to another wiring board.

2. Description of Related Art

There is a growing demand in recent years for increased density in mounting of electronic parts on e.g. a printed wiring board and a ceramic substrate. As a way for satisfying such a demand, a bear-chip mounting method is attracting attention. In the bear-chip mounting method, conventional face-up mounting is being taken over by a face-down mounting, i.e. flip chip bonding. In the face-up mounting, electric connection between the semiconductor chip and the wiring board is established usually by means of wire bonding, whereas in the face-down mounting, electrical connection is established by solder bumps between the semiconductor chip and the wiring board. This technique of establishing electrical connection via the solder bumps or solder material is also applied to a connection between two separate semiconductor chips or between two separate wiring boards, as disclosed in JP-A-2-96343, JP-A-4-326747, JP-A-5-326628, JP-A-6-262386, JP-A-8-64639, JP-A-9-260059, JP-A-11-135552, JP-A-11-191673 for example.

FIGS. 6a through 6j show a conventional method for making a flip chip bonding. According to the conventional flip chip bonding method, first, as shown FIG. 6a, a metal mask 430 is prepared, in which openings 430a are formed at positions corresponding to electrodes 411 of a semiconductor 410.

Next, as shown in FIG. 6b, the metal mask 430 is placed on the semiconductor chip 410 with the openings 430a aligned with the correspondingelectrodes 411.

Next, as shown in FIG. 6c, a solder paste 440 containing a predetermined solder powder is filled into the openings 430a by means of printing.

Next, as shown in FIG. 6d, the metal mask 430 is removed from the surface of the semiconductor chip 410, leaving the solder paste 440.

Next, as shown in FIG. 6e, a heating step follows for melting the solder powder in the solder paste 440 to form bumps 412 on the electrodes 411.

After the formation of the bumps 412 on the electrodes 411 of the semiconductor chip 410, a flux 450 is applied on the wiring board 420, as shown in FIG. 6f. The flux 450 serves to remove an oxide coating from the surface of the bumps 412 while preventing the bumps 412 from re-oxidizing by prohibiting contact with air during the subsequent re-flow soldering step. The flux 450 also performs an additional function of providing preliminary fixation of the semiconductor chip 410 onto the wiring board 420.

Next, as shown in FIG. 6g, the semiconductor chip 410 is placed on the wiring board 420 with electrodes 421 of the wiring board 320 aligned with the corresponding bumps 412.

Next, as shown in FIG. 6h, a heating step for re-flowing the bumps 412 follows to connect the electrodes 411 and the electrodes 421 with the bumps 412.

Next, as shown in FIG. 6i, the flux 450 is washed and removed. In this way, the flip chip bonding of the semiconductor chip 410 to the wiring board 420 is established.

Finally, as shown in FIG. 6j, an adhesive or an under-fill resin 460 is loaded between the semiconductor chip 410 and the wiring board 420. The under-fill resin 460 protects the bump 412 that serves as a conductor to connect the electrode 411 and the electrode 421 while also protecting the surface of the semiconductor chip 410 and the surface of the wiring board 420, thereby maintaining the bond reliability for a long time.

However, according to the conventional bonding process described above, when the metal mask 430 is placed on the semiconductor chip 410, the openings 430a must be aligned with the electrodes 411, which becomes increasingly difficult as the electrodes 411 are disposed at a smaller pitch. In particular, when the electrodes 411 are disposed at a pitch of not greater than 200 $\mu$m, the relative magnitude of an alignment error in placing the metal mask 430 becomes very large. Thus, the alignment error in the metal mask 430 results in positional error of the bumps 412 and may cause damage or loss of electric conduction in the flip chip bonding.

When the electrodes 411 are disposed at a pitch not greater than 200 $\mu$m, and if the size of electrodes 412 is half the pitch, the bumps 412 formable on the electrode 411 can have a diameter of about 70 $\mu$m. After bonding via the bumps 412 of such a size, the semiconductor chip 410 and the wiring board 420 is spaced by a distance not greater than 50 $\mu$m. If the distance between the semiconductor chip 410 and the wiring board 420 is so small as such, it is difficult to remove the flux sufficiently in the process step of FIG. 6i. The flux remaining between the semiconductor chip 410 and the wiring board 420 can cause such problems as corrosion of the bumps 412, decrease of dielectric resistance between the electrodes, and insufficient filling of the under-fill resin 460. In addition, if the distance between the semiconductor chip 410 and the wiring board 420 is that small, voids can easily develop in the under-fill resin 460 in the process step of FIG. 6j, making it difficult to properly fill the under-fill resin 460 between the semiconductor chip 410 and the wiring board 420.

Thus, according to the conventional method, it is difficult to obtain a high bond reliability when the electrodes are disposed at a small pitch or at a high density.

Further, according to the above-described conventional method, a large number of steps including application and removal of the flux 450 and filling of the under-fill resin 460 must be performed. In other words, the process is complex.

For the purpose of simplifying the bonding process, a fluxing under-fill resin is used in recent years. The fluxing under-fill resin is an epoxy resin containing a flux as an additive, and is intended to serve as an under-fill resin as well as a flux. For example, the fluxing under-fill resin is applied on the wiring board 420 in the step of FIG. 6f, just as the flux is applied, and then heated, without being washed or removed, to harden between the semiconductor chip 410 and the wiring board 420 in the step of FIG. 6j, just like an ordinary under-fill resin 460.

The fluxing under-fill resin has to contain an inorganic filler in order to reduce its thermal expansion coefficient, thereby attaining reliability of the bond between the semiconductor chip 410 and the wiring board 420. However, if the inorganic filler is contained in the fluxing under-fill resin at a proportion of no lower than 20 wt %, such a large amount of the inorganic filler causes the fluxing under-fill resin to easily enter the boundary between each bump 412 and a corresponding electrode 421, resulting in a very sharp decrease of adhesion of the bump 412 relative to the electrode 421. For this reason, the addition of the inorganic filler to the extent of reducing the thermal expansion of the fluxing under-fill resin to a necessary level can result in an initial conduction failure caused by the poor bonding rate of the bumps. Another problem is that the fluxing under-fill resin is poor in utility because it is a single-liquid adhesive and has a short service life at room temperature.

SUMMARY OF THE INVENTION

It is, therefore, an object of the present invention to provide a process of forming an electrode-to-electrode bond structure suitable for high-density mounting, capable of achieving a sufficient reliability of the bond and achievable in a small number of steps.

Another object of the present invention is to provide an electrode-to-electrode bond structure formed by such a process.

According to a first aspect of the present invention, a process is provided for making an electrode-to-electrode bond structure. The method comprises the steps of forming a resin coating on a first bonding object having a first electrode portion for covering the first electrode portion, forming an opening in the resin coating to expose the first electrode portion, filling the opening with a metal paste containing a metal, placing the first bonding object and a second bonding object having a second electrode portion in a manner such that the metal paste filled in the opening faces the second electrode portion while the resin coating contacts the second bonding object, and bonding the first bonding object and the second bonding object by heat-treatment which causes the first electrode portion and the second electrode portion to be electrically connected with each other via the metal while causing the resin coating to harden.

Such a process of making an electrode-to-electrode bond structure is suitable for high-density mounting with a reduced number of process steps in bonding and electrically connecting a semiconductor chip to a semiconductor chip, in mounting a semiconductor chip on a wiring board, and in connecting a wiring board to a wiring board, while achieving a sufficient reliability of the bond.

According to the first aspect of the present invention, no bump is formed on the first bonding object in the step of placing the first bonding object in facing relationship to the second bonding object. There is no need, therefore, to apply flux to the second bonding object for removing the oxide coating from the bump surfaces and for preventing re-oxidation of the bump surfaces. Further, since the alignment is performed via the viscous metal paste filled in the openings of the resin coating, there is no need either to apply flux for provisionally fixing the first bonding object to the second bonding object. Since no flux is used in the step of placing the first bonding object relative to the second bonding object in an appropriate orientation, even if there is only a small spacing between the first bonding object and the second bonding object, there is no troublesome step of washing the flux away.

Further, the resin coating hardens when the metal in the metal paste is melted, whereby the first bonding object and the second bonding object are bonded together by the resin coating. Therefore, even if there is only a small spacing between the first bonding object and the second bonding object, it is possible to bond the two objects together by the intervening resin coating which is placed in between in advance.

As described above, since there is no need for removing the flux from and filling the under-fill resin to between the first bonding object and the second bonding object, it becomes possible to provide electrodes on the first and the second bonding objects at a fine pitch. It is also possible to reduce the spacing between the first bonding object and the second bonding object to no greater than 50 $\mu$m. Thus, the present invention is suitable for high-density mounting.

Further, according to the present invention, there is no need for coating and removing a flux, and for filling an under-fill resin. Therefore, the number of process steps is reduced in comparison with the conventional process.

A liquid fluxing under-fill resin, which has been conventionally used, may remain at bump-to-electrode interfaces, thus deteriorating the bump-to-electrode connections. According to the present invention, on the contrary, the resin coating does not enter between the electrode portion and the metal paste. Thus, even if the inorganic filler is added at a proportion of 20 wt % or more for regulating the thermal expansion of the resin coating, the filler does not cause an initial conduction failure due to improper electrical connection. Therefore, a sufficient amount of the inorganic filler may be added for achieving a sufficient bonding reliability in the electrode-to-electrode bond structure.

In a preferred embodiment, the metal is a solder powder which melts in the bonding step. Preferably, the metal paste contains a resin component which hardens in the bonding step. Further, the resin coating should preferably soften at a temperature not higher than a melting point of the metal.

In another preferred embodiment, the metal comprises Ag or Cu, and the metal paste contains a resin component which is allowed to harden in the bonding step without melting of the metal. In this embodiment, the resin coating should preferably soften at a temperature not higher than a hardening temperature of the resin component.

Preferably, the metal has a melting point of 80–380° C.

Preferably, the resin coating is photosensitive.

Preferably, the resin coating is provided by a film.

Preferably, the metal is contained in the metal paste at a proportion of 30–70 vol %.

Preferably, the resin component and the resin coating contain a same main resin ingredient. In this case, the resin component and the resin coating are integrated with each other in the bonding step.

Alternatively, the resin coating contains a main resin ingredient, whereas the resin component contains a hardener for hardening the main resin ingredient.

Conversely, the resin component may contain a main resin ingredient, whereas the resin coating may contain a hardener for hardening the main resin ingredient.

Preferably, the resin coating contains an inorganic filler at a proportion of 30–70 wt %.

Preferably, the bonding step may comprise pressing one of the first bonding object and the second bonding object against the other of the first bonding object and the second bonding object.

According to a second aspect of the present invention, another process is provided for making an electrode-to-electrode bond structure. The process comprises the steps of forming a resin coating on a first bonding object having a first electrode portion in a manner such that the resin coating covers the first electrode portion, forming an opening in the resin coating to expose the first electrode portion, forming a conductor in the opening, placing the first bonding object relative to a second bonding object having a second electrode portion in a manner such that the second electrode portion faces the conductor while the resin coating contacts the second bonding object, and bonding the first bonding object and the second bonding object by heat-treatment which causes the first electrode portion and the second electrode portion to be electrically connected with each other via the conductor while causing the resin coating to harden.

Like the process according to the first aspect of the present invention, the process according to the second aspect does not require removal of flux from the gap between the first bonding object and the second bonding object, nor supply of under-fill resin into the gap. Therefore, the process according to the second aspect enjoys the same advantages (high density mounting, high bond reliability and reduction of the process steps) as the process according to the first aspect.

Preferably, the conductor is melted for fusion to the first electrode portion and/or the second electrode portion in the bonding step.

Preferably, the conductor is formed by electroplating and/or electroless plating.

Preferably, the conductor has a laminate structure having a plurality of layers each made of a different metal.

Preferably, at least a part of the conductor has a melting point of 80–400° C.

Preferably, the resin coating is photosensitive.

Preferably, the resin coating is provided by a film.

Preferably, the resin coating contains an inorganic filler at a proportion of 30–70 wt %.

Preferably, the bonding step comprises pressing one of the first bonding object and the second bonding object against the other of the first bonding object and the second bonding object.

According to a third aspect of the present invention, another process is provided for making an electrode-to-electrode bond structure. The process comprises the steps of forming a resin coating on a first bonding object having a first electrode portion in a manner such that the resin coating covers the first electrode portion, forming an opening in the resin coating to expose the first electrode portion, filling the opening with a bump forming material containing a metal, forming a bump at the opening by heating, placing the first bonding object relative to a second bonding object having a second electrode portion in a manner such that the second electrode portion faces the bump while the resin coating contacts the second bonding object, and bonding the first bonding object and the second bonding object by heat-treatment which causes the first electrode portion and the second electrode portion to be electrically connected with each other via the metal while causing the resin coating to harden.

The process according to the third aspect is suitable for high-density mounting with a reduced number of process steps while also being capable of achieving a sufficient bonding reliability, for the same reasons as described above for the first aspect of the present invention.

A fourth aspect of the present invention provides an electrode-to-electrode bond structure formed by either one of the above-described processes.

According to a fifth aspect of the present invention, a process is provided for connecting a first bonding object and a second bonding object, wherein the first bonding object is provided with a first electrode portion and a resin coating which has an opening for exposing the first electrode portion but otherwise covers the first bonding object, and wherein the second bonding object is provided with a second electrode corresponding to the first electrode portion. The process comprises the steps of filling the opening with a metal paste containing a metal, placing the first bonding object relative to a second bonding object in a manner such that the first electrode portion faces the second electrode portion while the resin coating contacts the second bonding object, and bonding the first bonding object and the second bonding object by heat-treatment which causes the first electrode portion and the second electrode portion to be electrically connected with each other via the metal while causing the resin coating to harden.

According to a sixth aspect of the present invention, a process is provided for connecting a first bonding object and a second bonding object, wherein the first bonding object is provided with a first electrode portion and a resin coating which has an opening for exposing the first electrode portion but otherwise covers the first bonding object, and wherein the second bonding object is provided with a second electrode corresponding to the first electrode portion. The process comprises the steps of forming a conductor in the opening, placing the first bonding object relative to the second bonding object in a manner such that the first electrode portion faces the conductor while the resin coating contacts the second bonding object, and bonding the first bonding object and the second bonding object by heat-treatment which causes the first electrode portion and the second electrode portion to be electrically connected with each other via the conductor while causing the resin coating to harden.

According to a seventh aspect of the present invention, a process is provided for connecting a first bonding object and a second bonding object, wherein the first bonding object is provided with a first electrode portion and a resin coating which has an opening for exposing the first electrode portion but otherwise covers the first bonding object, and wherein the second bonding object is provided with a second electrode corresponding to the first electrode portion. The process comprises the steps of filling the opening with a bump forming material containing a metal, forming bumps at the opening by heating, placing the first bonding object relative to the second bonding object in a manner such that the second electrode portion faces the bump while the resin coating contacts the second bonding object, and bonding the first bonding object and the second bonding object by heat-treatment which causes the first electrode portion and the second electrode portion to be electrically connected with each other via the bump while causing the resin coating to harden.

Like the process according to the first aspect of the present invention, the process according to each of the fifth to the seventh aspects does not require removal of flux from the gap between the first bonding object and the second bonding object, nor supply of under-fill resin into the gap. Therefore, the process according to each of these aspects enjoys the same advantages (high density mounting, high bond reliability and reduction of the process steps) as the process according to the first aspect.

According to an eighth aspect of the present invention, a process is provided for preparing an intermediate product used for making an electrode-to-electrode bond structure. The process comprises the steps of forming a resin coating on a first bonding object having a first electrode portion in a manner such that the resin coating covers the first electrode portion, forming an opening in the resin coating to expose the first electrode portion, and forming a conductor in the opening, wherein the resin coating is hardenable by heating.

According to a ninth aspect of the present invention, a process is provided for preparing another intermediate product used for making an electrode-to-electrode bond structure. The process comprises the steps of forming a resin coating on a first bonding object having a first electrode portion in a manner such that the resin coating covers the first electrode portion, forming an opening in the resin coating to expose the first electrode portion, and filling the opening with a bump forming material containing a metal, wherein the resin coating is hardenable by heating for re-flow of the bump forming material.

A tenth aspect of the present invention provides an intermediate product formed by the above-described process of preparing such an intermediate product.

According to an eleventh aspect of the present invention, an electrode-to-electrode bond structure is provided which comprises a first bonding object having a first electrode portion, a second bonding object having a second electrode portion facing the first electrode portion, an electric conductor having a intermediate constricted portion for connecting the first electrode portion and the second electrode portion, and a sealing resin sealing a gap between the first bonding object and the second bonding object.

Preferably, the sealing resin contains an inorganic filler at a proportion of 30–70 wt %. Further, each of the first bonding and the second bonding object may be either a semiconductor chip or a wiring board.

Other objects, features and advantages of the present invention will become apparent from the following description of the preferred embodiments given with reference to the accompanying drawings.

DETAILED DESCRIPTION OF THE PREFERRED EMBODIMENTS

FIGS. 1a–1e show a series of process steps in making an electrode-to-electrode bond structure according to a first embodiment of the present invention. The following description of the present embodiment will be made for a flip chip bonding as an example.

Figure 1A:
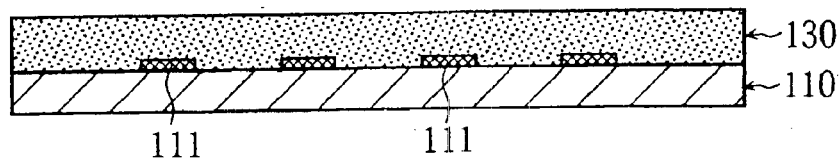
FIGS. 1a through 1e show the successive process steps of flip chip bonding in making an electrode-to-electrode bond structure according to a first embodiment of the present invention.

First, as shown in FIG. 1a, a resin coating 130 is formed on a semiconductor chip 110 which has a surface provided with electrodes 111. As a result, the resin coating 130 covers the electrodes 111. The formation of the resin coating 130 is made by first placing a resin film onto the semiconductor chip 110, and then pressing the resin film under heating at a temperature of 50–140° C. Alternatively, a liquid resin composition may be spin-coated and then thermally set on the surface of the semiconductor chip 110.

The resin composition for forming the resin coating 130 contains both or one of a main resin ingredient and a hardener, as well as an inorganic filler. The resin composition may be formed into a solid film prior to attachment to the semiconductor chip 110, or may be applied as a liquid to form a film in situ on the semiconductor chip 110. If formed into a solid film in advance, the thickness of the film is determined on the basis of the bond height that is estimated in view of the pitch between the electrodes 110, the size of the electrodes, and the required reliability of the bond.

The main resin ingredient is preferably an epoxy resin. A suitable epoxy resin, whether liquid or solid, may be selected from bisphenol-A epoxy, bisphenol-F epoxy, naphthalene epoxy, brominated epoxy, phenol novolak epoxy, cresol novolak epoxy, biphenyl epoxy and so on.

The hardener may be selected from imidazole hardeners, acid anhydride hardeners, amine hardeners, phenol hardeners, and so on. Examples of the imidazole hardeners include 2-phenyl-4-methyl imidazole, 2-undecyl imidazole, 2,4-diamino-6-[2-methyl imidazole-(1)]-ethyl-S-triazine, 1-cyano ethyl-2-ethyl-4-methyl imidazole, 1-cyano ethyl-2-undecyl imidazole, 2-phenyl-4-methyl-5-hydroxymethyl imidazole; 2-phenyl-4,5-dihydroxymethyl imidazole and so on. Examples of the acid anhydride hardeners include phthalic anhydride, maleic (acid) anhydride, tetrahydro phthalic anhydride, hexahydro phthalic anhydride, methyltetrahydro phthalic anhydride, methylhexahydro phthalic anhydride, himic anhydride, tetrabromo phthalic anhydride, trimellitic acid anhydride, pyromellitic acid anhydride, benzophenone tetracarboxylic acid anhydride, and so on. Examples of the amine hardeners include diethylene triamine, triethylene tetramine, menthane diamine, isophorone diamine, metaxylene diamine, diamino diphenylmethane, metaphenylene diamine, diamino diphenylsulfone, and so on.

The inorganic filler may be silica powder or alumina powder. The proportion of inorganic filler to be contained in the resin composition for forming the resin coating 130 is preferably 30–70 wt %.

The resin coating 130 may be rendered photosensitive if the resin composition contains an acrylate monomer and a photo polymerization initiator. The acrylate monomer may be either a monofunctional monomer, a bifunctional monomer, or a polyfunctional monomer. Examples of monofunctional monomers includes isobutyl acrylate, t-butyl acrylate, 1,6-hexanediol acrylate, lauryl acrylate, alkyl acrylate, cetyl acrylate, stearyl acrylate, cyclohexyl acrylate, isobornyl acrylate, benzyl acrylate, 2-methoxyethyl acrylate, 3-methoxybutyl acrylate, ethyl carbitol acrylate, phenoxyethyl acrylate, tetrahydrofurfuryl acrylate, phenoxy polyethylen acrylate, methoxy tripropylene glycol acrylate, 2-hydroxyethyl acrylate, 2-hydroxypropyl acrylate, 2-acryloyloxyethyl-2-hydroxypropyl phthalate, 2-hydroxy-3-phenoxypropyl acrylate, 2-acryloyloxyethyl hydrogen phthalate, cyclohexane-1,2-dicarboxylic acid mono-(2-acryloyloxy-1-methyl-ethyl) ester, cyclohexane-4-ene-1,2-dicarboxylic acid mono-(2-acryloyloxy-1-methyl-ethyl)

ester, dimethyl aminoethyl acrylate, trifluoroethyl acrylate, and hexafluoropropyl acrylate. Examples of bifunctional monomers include 1,4-butanediol diacrylate, 1,6-hexandiol diacrylate, 1,9-nonane diolacrylate, neopentylglycol diacrylate, tetraethyleneglycol diacrylate, tripropyleneglycol diacrylate, bisphenol-A EO-addition diacrylate, and glycerol methacrylate acrylate. Examples of multifunctional monomers include trimethylolpropane triacrylate, trimethylpropane EO-addition triacrylate, pentaerythritol triacrylate, trimethylolpropane EO-addition triacrylate, glycerol PO-addition triacrylate, trisacryloyloxyethyl phosphate, and pentaerythritol tetracrylate. Alternatively or in addition to the acrylate monomer, an oligomer such as bisphenol-A-diepoxy acrylic acid adduct may be used. The proportion of the acrylate monomer to be contained in the resin composition is preferably 1–50 wt %.

The polymerization initiator may be selected from 2,2-dimethoxy-1,2-diphenylethane-1-on, 1-hydroxy-cyclohexyl-phenyl-ketone, 2-methyl-1-[4-(methylthio) phenyl]-2-morpholinopropane-1-on, 2-benzil-2-dimethylamino-1-(4-morpholinophenyl)-butane-1-on, 2-hydroxy-2-methyl-1-phenyl-propane-1-on, 1-[4-(2-hydroxyethoxy)-phenyl]-2-hydoxy-2-methyl-1-propane-1-on, bis (cyclopentadienyl)-bis (2,6-difluoro-3-(byl-1-yl) titanium, and so on. The proportion of the polymerization initiator to be contained in the resin composition for forming the resin coating 130 is preferably 0.1–4 wt %.

The resin composition for forming the resin coating 130 may also contain a thermoplastic resin such as polyester and acryl.

Figure 1B:
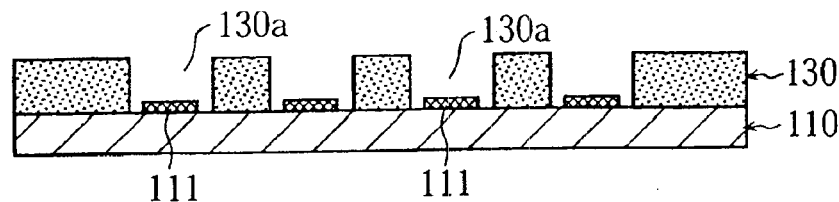

After forming the resin coating 130, as shown in FIG. 1b, the resin coating 130 is formed with openings 130a at positions corresponding to the electrodes 111. The formation of the openings 130a may be performed by UV-YAG laser, $CO_2$ laser, excimer laser, and so on. When the resin coating 130 is photosensitive, the openings 130a may be formed by photolithography which is preferable for reducing damage to the electrodes. In the photolithography, the resin coating 130 undergoes light exposure using a predetermined photo mask (not illustrated), and development. As a result, the openings 130a are formed to expose the electrodes 111.

Figure 1C:
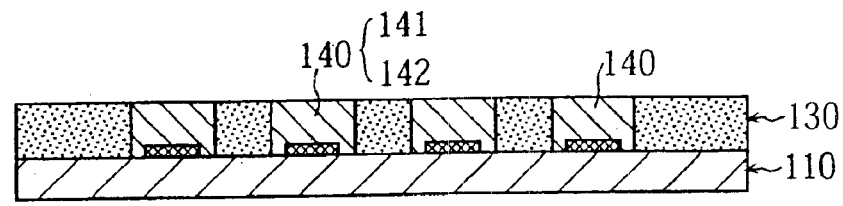

Then, as shown in FIG. 1c, the openings 130a are filled with a metal paste 140. The filling of the metal paste 140 is achieved by printing with the use of a squeegee (not illustrated). In order to avoid or reduce damage to the resin coating 130, the squeegee may be preferably made of an urethane rubber having a hardness of 50–80 (according to Japanese Industrial Standards K6253).

The metal paste 140 contains a metal powder 141 and a pasting resin component 142. According to the present embodiment, the metal powder 141 comprises solder powder prepared by selectively alloying Sn, Pb, Ag, Cu, In, Bi, Zn and Sb, followed by pulverizing. Alternatively, the metal powder 141 may comprise a powder of a low resistance metal such as Ag and Cu. In the case where use is made of solder powder as the metal powder 141, the resin composition for forming the resin coating 130 should be such that the resulting resin coating softens before the solder melts. On the other hand, if the metal powder 141 is provided by the low-resistance metal such as Ag and Cu, the resin composition should be controlled with respect to its ingredients so that the resulting resin coating 130 softens before the resin component 142 hardens. The metal paste 140 contains the metal powder 141 at a proportion of 30–70 vol % (or 20–95 wt %). At a proportion smaller than 30 vol % (or 20 wt %), it tends to be difficult to establish electrical connection between the electrodes, whereas at a proportion greater than 70 vol % (or 95 wt %), the metal paste 140 becomes excessively viscous, making it difficult to fill into the openings 130a. The resin component 142 is such as to allow the solder powder to melt into an integral body upon heating while, itself, integrating with the resin coating 130 after the melting of the solder powder.

Specifically, the resin component 142 may contain 30–70 wt % of an epoxy resin as the main ingredient and/or 70–30 wt % of an acid anhydride hardener. Examples of epoxy resins include bisphenol-A epoxy, bisphenol-F epoxy, and naphthalene epoxy, all in a liquid form. Examples of acid anhydride hardeners include tetrahydro phthalic anhydride, hexahydro phthalic anhydride, 4-methyltetrahydro phthalic anhydride, and 4-methylhexahydro phthalic anhydride. However, the main ingredient and the hardener to be contained in the resin component 142 may be selected from those main ingredients and hardeners listed for the resin coating 130.

If the resin coating 130 contains the hardener but not the main ingredient, the resin component 142 of the metal paste 140 may contain the main ingredient but not the hardener. Likewise, if the resin coating 130 contains the main ingredient but not the hardener, the resin component 142 may contain the hardener but not the main ingredient. In the latter case, the metal paste 140 does not contain the main ingredient but contains the hardener and the metal powder 141 dispersed therein. In such a composition, the hardener should preferably be provided by an acid anhydride hardener or an amine hardener.

Additionally, the metal paste 140 may contain rosin for improved wettability. Examples of rosins include rosin acid, rosin acid ester, rosin acid anhydride, fatty acid, abietic acid, isopimaric acid, neoabietic acid, pimaric acid, dihydroabietic acid, and dehydroabietic acid. Further, the metal paste 140 may contain, besides the main ingredient and the hardener, organic carboxylic acid or amine for activating the metal surface. The metal paste 140 may further contain diethylene glycol, tetraethylene glycol or other higher alcohol for adjusting viscosity.

Figure 1D:
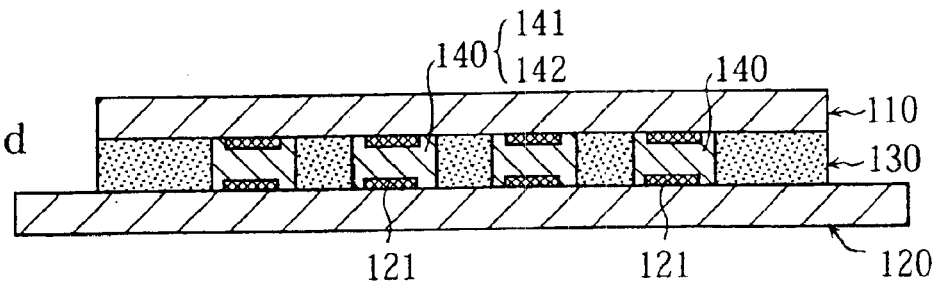

After the metal paste 140 is filled, as shown in FIG. 1d, a semiconductor chip 110 is placed on a wiring board 120. At this time, the portions of the metal paste 140 filled in the openings 130a of the resin coating 130 are aligned with the respective electrodes 121 of the wiring board 120. Further, a force is applied to press the resin coating 130 tightly against the wiring board 120.

Figure 1E:
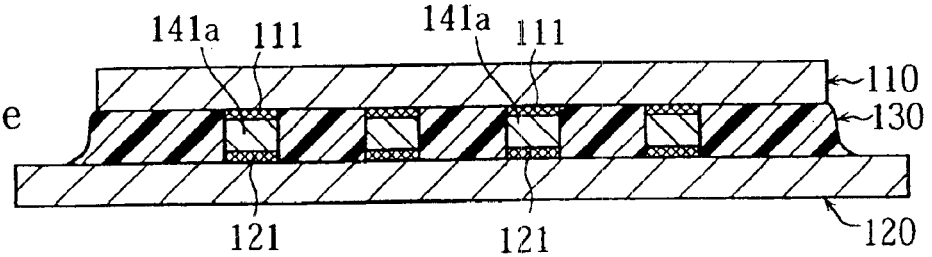

Next, as shown in FIG. 1e, re-flow heating is performed to mechanically bond the semiconductor chip 110 to the wiring board 120 while electrically connecting the electrodes 111 to the counterpart electrodes 121. According to the present embodiment, solder powder is used as the metal powder 141 contained in the metal paste 140. Therefore, the temperature to be achieved as a target in the heating step is 10–50° C. higher than the melting point of the solder used.

During the heating step, the resin coating 130 between the semiconductor chip 110 and the wiring board 120 softens once at a temperature lower than the solder melting point. Subsequently, the metal powder 141 melts to form conductors 141a which establish electrical connection between the electrodes 111 and the counterpart electrodes 121, whereas the resin coating 130 hardens by polymerization. The hardening of the resin coating 130 establishes a bond between the semiconductor chip 110 and the wiring board 120.

In this way, the semiconductor chip 110 can be electrically and mechanically bonded to another semiconductor chip or wiring board in a single heating process.

Figure 2:
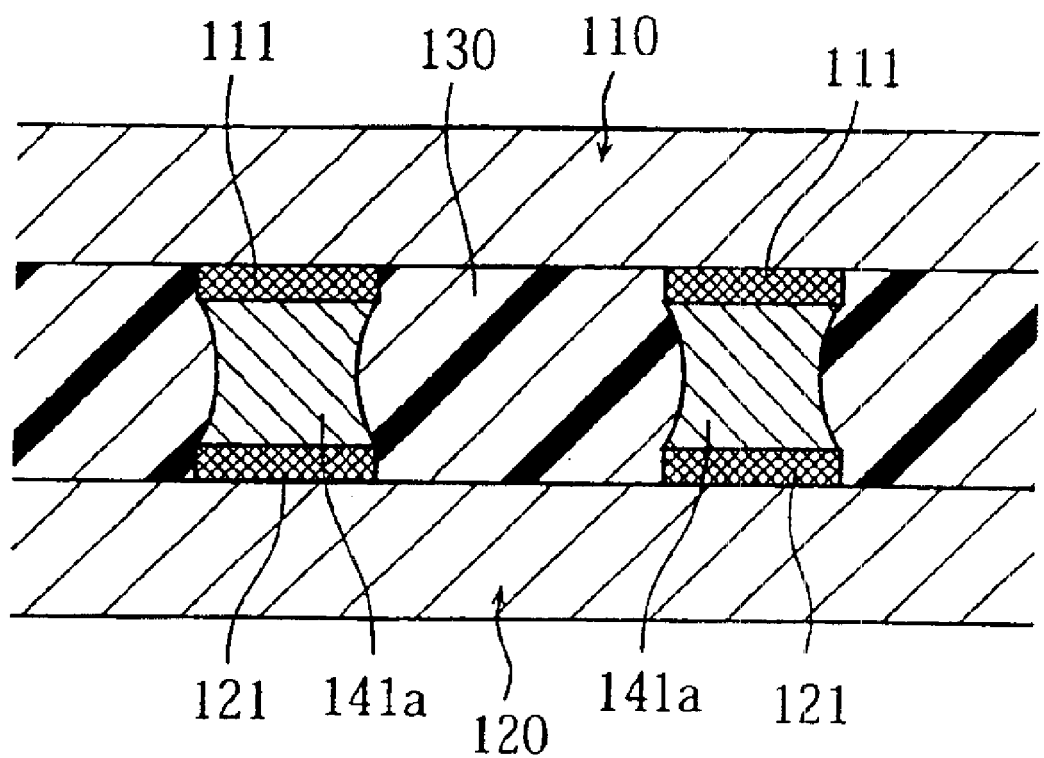
FIG. 2 is an enlarged sectional view showing a principal portion of the electrode-to-electrode bond structure formed by the process of FIGS. 1a through 1e.

FIG. 2 is an enlarged sectional showing a principal portion of the electrode-to-electrode bond structure formed by the process steps shown in FIGS. 1a–1e. The proportion of the metal powder 141 in the metal paste 140 is 30–70 vol %, as described above. Therefore, after the electrodes are connected together in the re-flow process step, each conductor 141a which provides an electrical connection between the electrode 111 and the electrode 121 takes a shape like a bobbin which has a constricted intermediate portion. With the conductor 141a having such a shape, stresses acting on the conductor 141a concentrate not at the conductor-to-electrode interface but at a central portion of the conductor 141a. Therefore, a high connection reliability is achieved with respect to the electrode-to-electrode connection.

If the metal powder 141 comprises powder of a low resistance metal such as Ag, Cu in place of solder powder, the bonding step of FIG. 1e is achieved by using a chip bonder (having dual functions of heating and pressing) instead of utilizing a re-flow heating furnace. The heating temperature in this case is so set as to cause the resin component 142 to harden without melting of the metal powder 141 contained the metal paste 140. During this heating or bonding step, the resin coating 130 between the semiconductor chip 110 and the wiring board 120 softens once at a temperature lower than the hardening point of the resin component 142 as the temperature increases. As a result, the metal powder 141 gathers under pressure to establish an electrical connection between the electrodes 111 and the counterpart electrodes 121, whereas the resin coating 130 hardens by polymerization. The hardening of the resin coating 130 establishes a bond between the semiconductor chip 110 and the wiring board 120. In this way, when the powder of low resistance metal such as Ag, Cu is used as the metal powder 141, an appropriate electrode-to-electrode connection is obtained without melting the metal powder 141.

FIG. 3 shows the successive process steps for forming an electrode-to-electrode connecting structure according to a second embodiment of the present invention. Again, description will be made using flip chip bonding as an example.

Figure 3A:
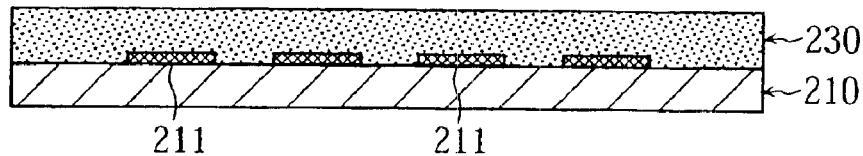
FIGS. 3a through 3e show the successive process steps of flip chip bonding in making an electrode-to-electrode bond structure according to a second embodiment of the present invention.

First, as shown in FIG. 3a, a resin coating 230 is formed on a semiconductor chip 210 which has a surface provided with electrodes 211 in the same manner as described for the first embodiment. As a result, the resin coating 230 covers the electrodes 211.

Figure 3B:
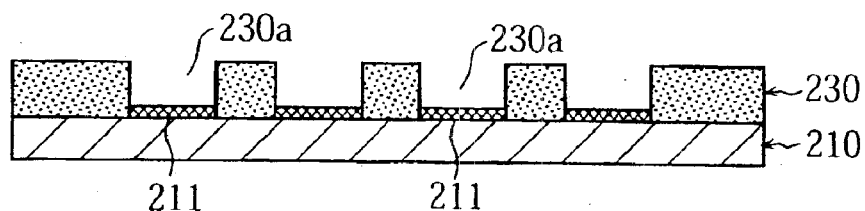

Then, as shown in FIG. 3b, the resin coating 230 is formed with openings 230a at positions corresponding to the electrodes 211 in the same manner as described for the first embodiment.

Figure 3C:
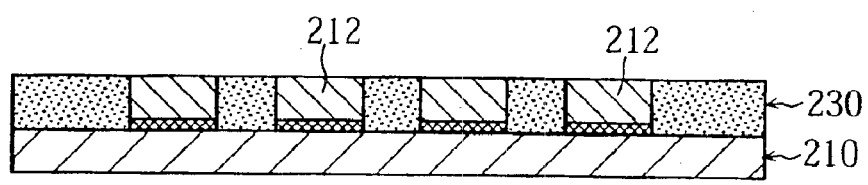

Then, as shown in FIG. 3c, conductors 212 are formed in the respective openings 230a. The conductors 212 may be formed by electroplating or electroless plating.

FIGS. 4a through 4d show the successive steps of forming the conductors 212 by electroplating.

Figure 4A:
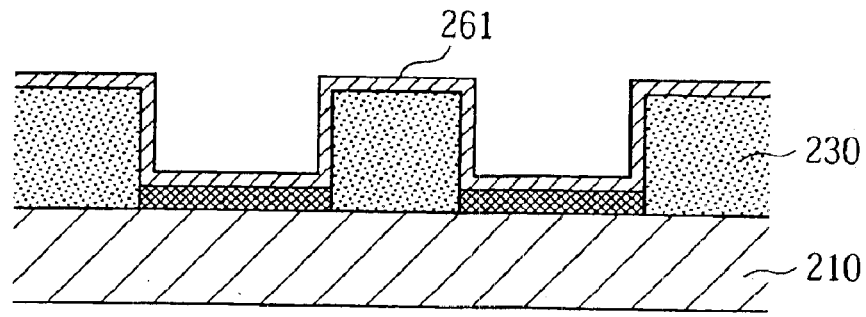
FIGS. 4a through 4d show the sub-steps of forming a conductor in the process according to the embodiment.

First, as shown in FIG. 4a, an electroplating terminal layer 261 is formed over the resin coating 230 and the electrodes 211 by sputtering Ti or Ni for example. The terminal layer 261 is used for establishing electrical connection with one pole of an electroplating apparatus (not shown).

Figure 4B:
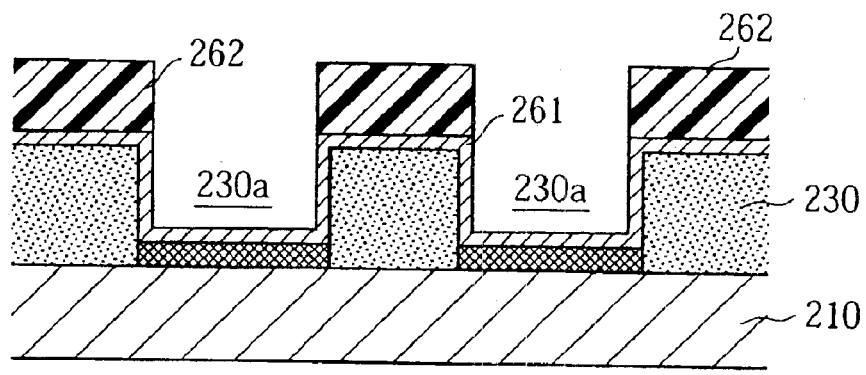

Then, as shown in FIG. 4b, a resist layer 262 is formed over the conductive layer 261 and patterned by known photolithography to be open at the openings 230a.

Figure 4C:
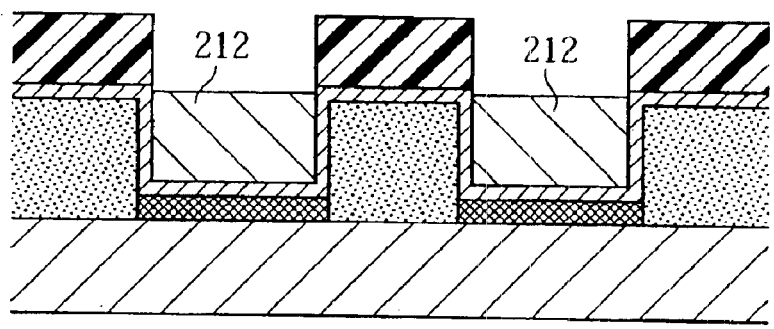

Then, as shown in FIG. 4c, a conductor 212 is deposited and grown in each of the openings 230a by electroplating.

Figure 4D:
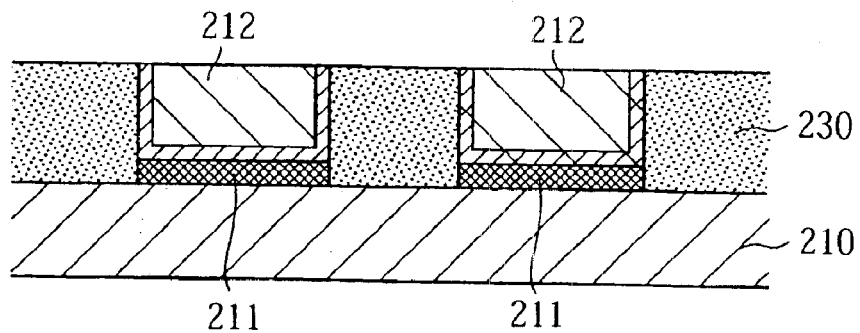

Finally, as shown in FIG. 4d, the resist layer 262 is etched away, followed by partial removal of the conductive layer 261 from the top surface of the resin coating 230.

Alternatively, an electroplating terminal layer 261 may be formed before forming the resin coating 230 (see FIG. 3a). In this case, the terminal layer 261 should be patterned to avoid shorting between the electrodes 211 on the wiring board 210 while enabling them to be electrically connected to one pole of the non-illustrated electroplating apparatus. After the formation and patterning of such a terminal layer, the resin coating 230 is formed (FIG. 3a) and patterned to have openings 230a (FIG. 3b). Then, the conductors 212 may be formed selectively in the openings 230a by utilizing the patterned resin coating 230.

Instead of the electroplating process, electroless plating may be relied on for forming the conductors 212. In this case, a predetermined catalyst is applied onto the electrodes 211 after the formation of the openings 230a (FIG. 3b), followed by growth of conductors 212 on the electrodes 211 within the respective opening 230a by means of electroless plating.

The conductors 212 may be made of an elemental metal such as Al, Au, In, Sn, Cu, Ag or Pd. Alternatively, the conductors 212 may be made of a composite metal which may be prepared by selectively alloying such metals as Sn, Pb, Ag, Cu, In, Bi, Zn and Sb. In the case where the conductors 212 is made of a low-melting-point metal such as In or Sn—Bi alloy, the resin coating 230 may be made to harden at a relatively low temperature. As a result, it is possible to suppress the adverse influences which may result from a difference of thermal expansion between the semiconductor chip 210 and the wiring board 220. An example of the adverse influences is a failure or deterioration of electrical connection caused by warping of the semiconductor chip 210 and/or the wiring board 220. Further, if the conductors 212 melt at a temperature range in which the resin coating 230 softens, the circuitry surface of the wiring board 220 is unlikely to be damaged by subsequent pressing of the semiconductor chip 210 against the wiring board 220 for chip mounting.

Figure 3D:
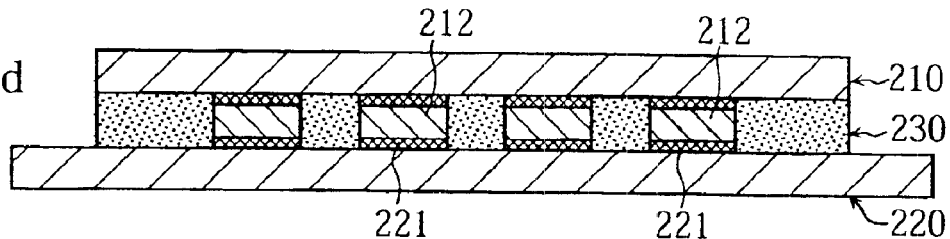

After the formation of the conductors 212 (FIG. 3c), the semiconductor chip 210 is placed on a wiring board 220 in a manner such that the conductors 212 formed in the openings 230a of the resin coating 230 are aligned with the corresponding electrodes 221 of the wiring board 220, as shown in FIG. 3d. Further, a force is applied to press the resin coating 230 tightly against the wiring board 220. At this time, the conductors 212 are also pressed tightly against the corresponding electrodes 221 of the wiring board 220.

Figure 3E:
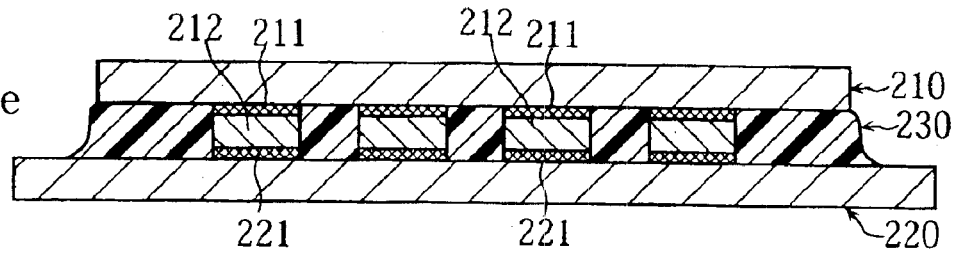

Then, as shown in FIG. 3e, heating is performed to mechanically bond the semiconductor chip 210 to the wiring board 220, and to electrically connect the electrodes 211 to the electrodes 221. In the course of the heating process, as the temperature increases, the resin coating 230 between the semiconductor chip 210 and the wiring board 220 softens once at a temperature lower than the melting point of the conductors 212. Subsequently, the conductors 212 fuse to the electrodes 211 and the counterpart electrodes 221 to establish electrical connection therebetween, whereas the resin coating 230 hardens by polymerization. The hardening of the resin coating 230 establishes a bond between the semiconductor chip 210 and the wiring board 220. If the conductors 212 is made of a metal having a melting point of 80–400° C., they fuse well to the electrodes 211, 221 assisted by diffusion to make the electrical connection highly reliable. However, the conductors 212 need not be heated to the point of melting as long as they provide good electrode-to-electrode conduction under compression against the electrodes 221.

In this way, according to the second embodiment, the semiconductor chip 210 can be electrically and mechanically bonded to another semiconductor chip or wiring board in a single heating step.

FIGS. 5a through 5f show the successive process steps for forming an electrode-to-electrode connecting structure according to a third embodiment of the present invention. Again, description will be made using flip chip bonding as an example.

Figure 5A:
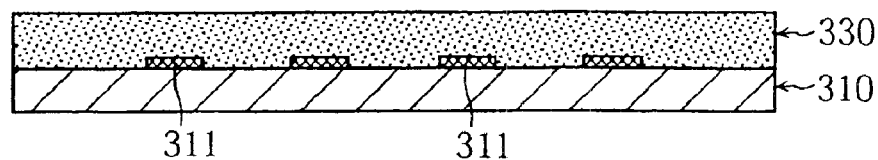
FIGS. 5a through 5f show the successive process steps of flip chip bonding in making an electrode-to-electrode bond structure according to a third embodiment of the present invention.

First, as shown in FIG. 5a, a resin coating 330 is formed on a semiconductor chip 310 which has a surface provided with electrodes 311. As a result, the resin coating 330 covers the electrodes 311.

Figure 5B:
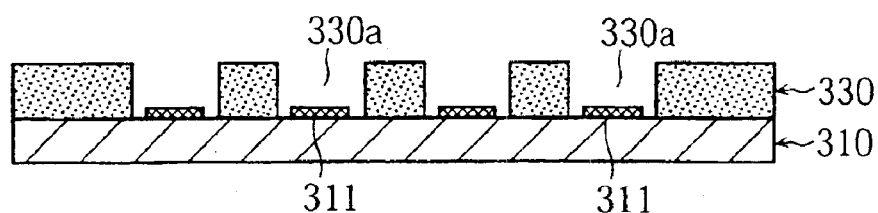

Then, as shown in FIG. 5b, the resin coating 330 is formed with openings 330a at positions corresponding to the electrodes 311.

Figure 5C:
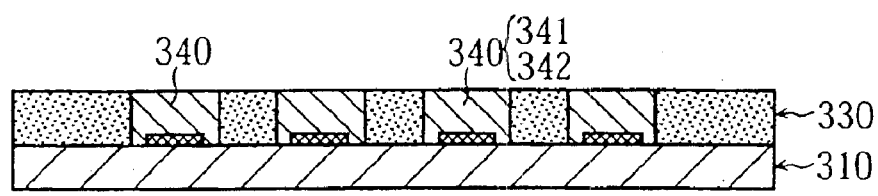

Then, as shown in FIG. 5c, the openings 330a are filled with a solder paste 340. The formation of the resin coating 330 and the openings 330a are made in the same way as described for the first mode of embodiment.

The solder paste 340 contains a solder powder 341 and a flux vehicle 342. The solder powder 341 may be prepared by selectively alloying such metals as Sn, Pb, Ag, Cu, In, Bi, Zn and Sb, and subsequently pulverizing the alloy. The flux vehicle 342 contains a rosin, an activator, a thixotropic agent, and a solvent. Examples of rosins include polymerised rosin, hydrogenated rosin, and esterified rosin. Examples of activators include organic acids and/or organic amines such as sebacic acid, succinic acid, adipic acid, glutaric acid, triethanolamine, monoethanolamine, and tributylamine. Examples of thixotropic agents include hydrogenated castor oil and hydrogenated castor oil. Examples of solvents include 2-methyl-2,4-pentadiol and diethylene glycol monobytylether.

Figure 5D:
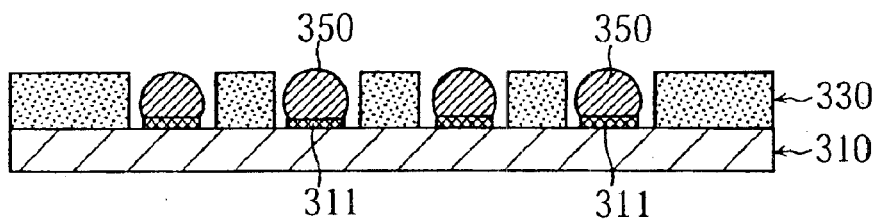

After filling the solder paste 340, as shown in FIG. 5d, a heating step is performed to form bumps 350. Specifically, heating causes melting of the solder paste 340 filled in the openings 330a. At this time, the flux vehicle 342 contained in the solder paste 340 escapes by evaporation, while the solder powder 341 melts to gather. Subsequent cooing completes the formation of the bumps 350.

Figure 5E:
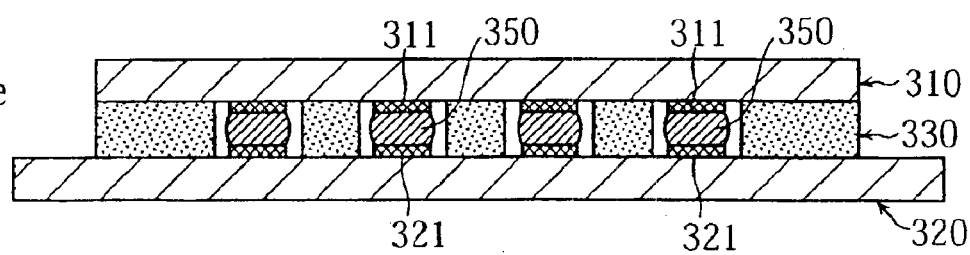

Next, as shown in FIG. 5e, the semiconductor chip 310 is placed on a wiring board 320 in a manner such that the bumps 350 formed in the openings 330a of the resin coating 330 are aligned with the corresponding electrodes 321 of the wiring board 320. Further, a force is applied to press the resin coating 330 tightly against the wiring board 320.

Figure 5F:
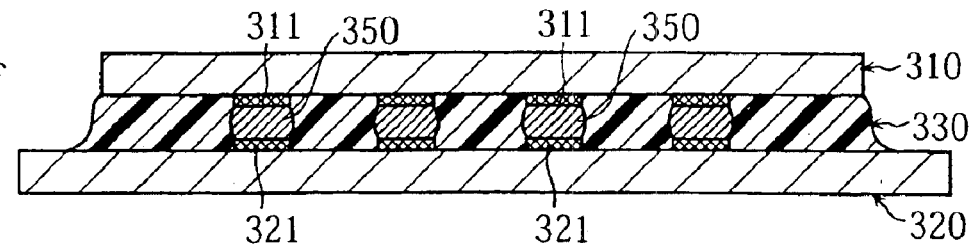
Figure 6A:
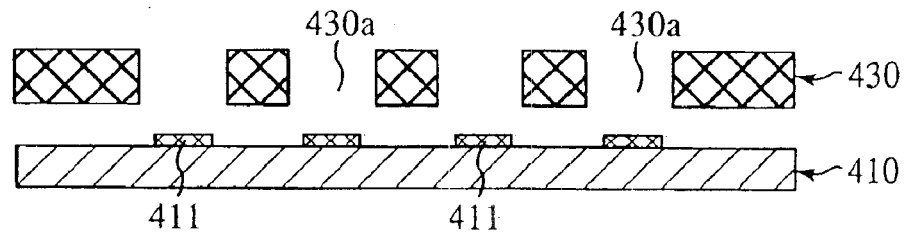
FIGS. 6a through 6j show the successive process steps of flip chip bonding in making a prior art electrode-to-electrode bond structure.
Figure 6B:
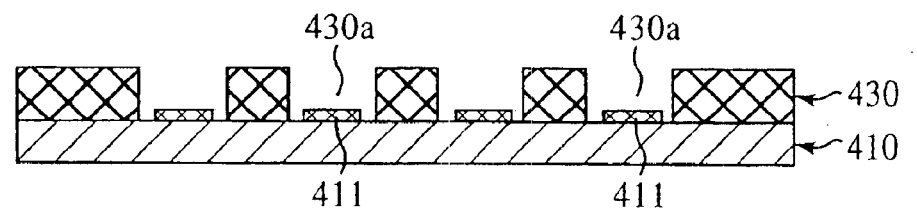
Figure 6C:
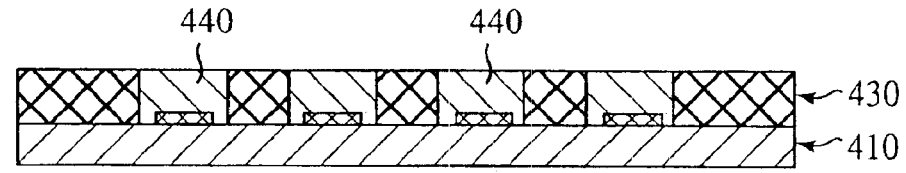
Figure 6D:
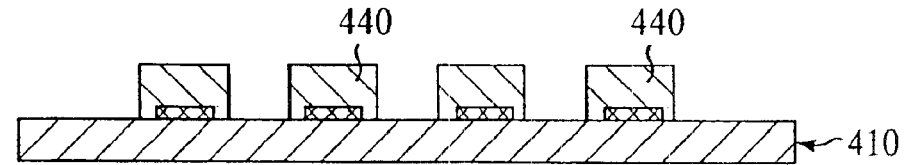
Figure 6E:
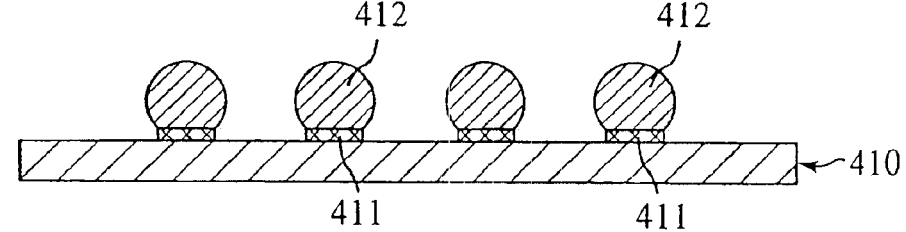
Figure 6F:
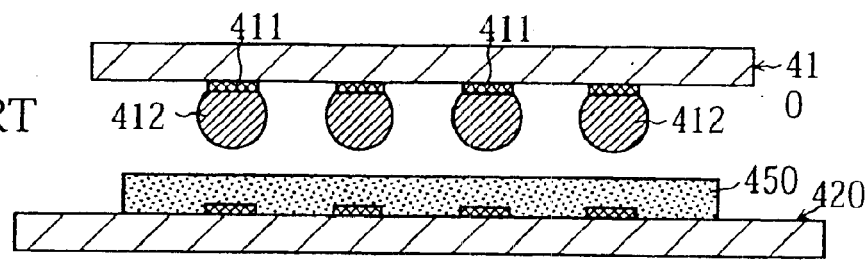
Figure 6G:
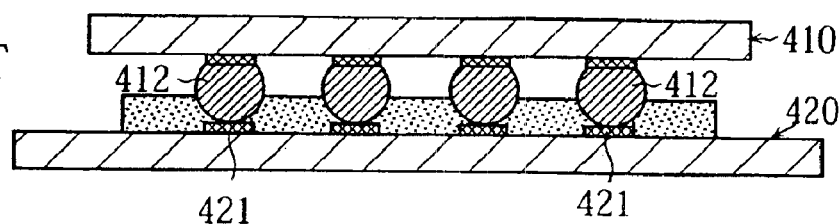
Figure 6H:
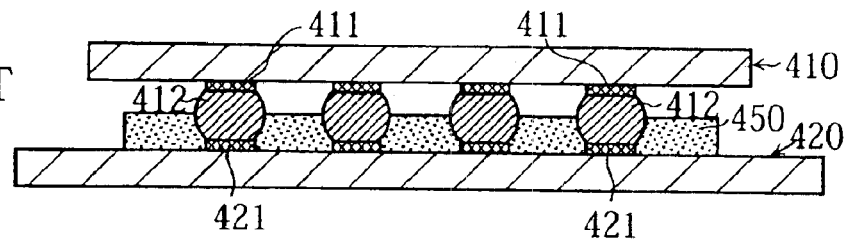
Figure 6I:
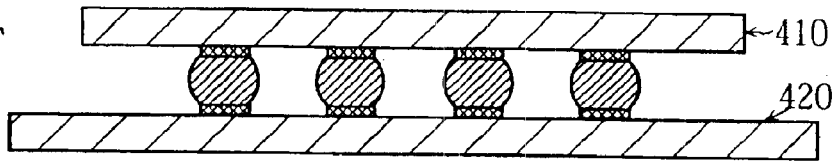
Figure 6J:
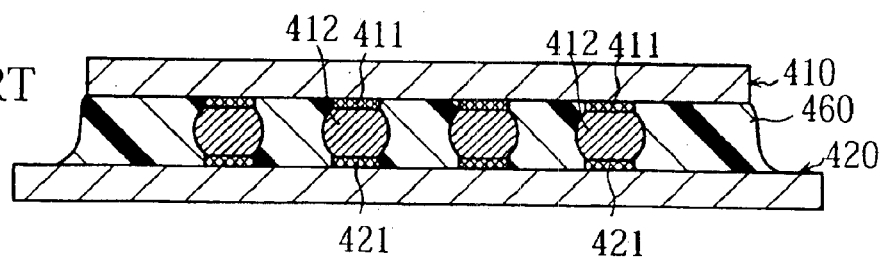

Then, as shown in FIG. 5f, re-flow heating is performed to mechanically bond the semiconductor chip 310 to the wiring board 320, and to electrically connect the electrodes 311 to the electrodes 321. The temperature to be achieved in the re-flow heating is 10–50° C. higher than the melting point of the solder used. During the heating process, as the temperature increases, the resin coating 330 between the semiconductor chip 310 and the wiring board 320 softens once at a temperature lower than the melting point of the bumps 350. Subsequently, the bumps 350 melt to establish electrical connection between the electrodes 311 and the counterpart electrodes 321, whereas the resin coating 330 hardens by polymerization. The hardening of the resin coating 330 establishes a bond between the semiconductor chip 310 and the wiring board 320.

In this way, according to the second embodiment, the semiconductor chip 310 can be electrically and mechanically bonded to another semiconductor chip or wiring board in a single heating step.

Thus far, methods of making an electrode-to-electrode bond structure according to the present invention have been described, taking the flip chip bonding as an example. The present invention can be applied not only to the flip chip bonding but also to bonding of a semiconductor chip to another semiconductor chip, and to bonding of a wiring board to another wiring board. Further, the present invention can also be applied to a batch production of a large-size substrate such as a wafer.

Specifically, applying to the first embodiment, formation of the resin coating 130, formation of the openings 130a, and filling of the metal paste 140 are performed with respect to a predetermined wafer. Then, the wafer is cut into plural chips of a necessary size. Then, each cut chip is bonded to another bonding object, following the process steps described earlier with reference to FIGS. 1d and 1e.

Applying to the second embodiment, formation of the resin coating 230, formation of the openings 230a, and formation of the conductors 212 are performed with respect to a predetermined wafer. Then, the wafer is cut into plural chips of a necessary size. Then, each cut chip is bonded to another bonding object, following the process steps described earlier with reference to FIGS. 3d and 3e.

Applying to the third embodiment, formation of the resin coating 330, formation of the openings 330a, and filling of the metal paste 340 and the formation of the bumps 350 are performed with respect to a predetermined wafer. Then, the wafer is cut into plural chips of a necessary size. Then, each cut chip is bonded to another bonding object, following the process steps described earlier with reference to FIGS. 5e and 5f.

EXAMPLES

Next, specific examples of the present invention will be described, along with a comparative example.

Example 1

<Preparation of Resin Film>

An intermediate resin composition was prepared, which contained 61 wt % of solid bisphenol-A epoxy resin (Product Name: AER6042 available from Asahi Kasei Epoxy Corporation) as a main ingredient, 15 wt % of liquid bisphenol-F epoxy resin (Product Name: GY260 available from Hitachi Chemical Co., Ltd.) as another main ingredient, 7 wt % imidazole (Product Name: 2MZ-A available from Shikoku Chemicals Corporation) as a solid hardener, 7 wt % of polymethyl methacrylate (Product Name: PMMA available from Aldrich Inc.) as an acrylic resin, 9 wt % of bisphenol A-diepoxy-acrylic acid adduct (Product Name: V#540 available from Osaka Organic Chemical Industry Ltd.) as an acrylate monomer, and 1 wt % of 2-benzil-2-dimethylamino-1-(4-morpholinophenyl)-butane-1-on (Product Name: Irgacure369 available from Ciba Specialty Chemicals Inc.) as a photo polymerization initiator. The intermediate resin composition was mixed with silica powder having an average grain size of 4 μm, at a weight ratio of 1:1 (i.e. the silica powder was mixed at a proportion of 50 wt %), and then formed into a film having a thickness of 50 μm (later used to form a resin coating for Example 1). The formation of the film was performed by solving or dispersing the resin composition in methyl ketone after the addition of and mixing with the silica powder, then applying the dispersion liquid onto a PET film, and then drying to remove the solvent.

<Preparation of Metal Paste>

A resin component was prepared, which contained 50 wt % of bisphenol-F epoxy resin (Product Name: GY260 available from Hitachi Chemical Co., Ltd.) as a main ingredient, and 50 wt % of methyltetrahydro phthalic anhydride (Product Name: HN-2200 available from Hitachi Chemical Co., Ltd.) as a hardener. The resin component was mixed with a powder of Sn-3.5% Ag having an average grain size of 13 μm, at a weight ratio of 1:9 (i.e. the Sn-3.5% Ag powder was added at a proportion of 90 wt %), to obtain a metal paste for Example 1.

<Flip-Chip Bonding>

The resin film prepared as described above was attached to a semiconductor chip so as to cover its electrodes (electrode diameter: 70 μm, electrode pitch: 150 μm, number of electrodes: 3000), using a roll mounter (available from MCK Co., Ltd.), while heating at 80° C., to form a resin coating. Next, the resin coating was subjected to exposure and development for forming openings each having a diameter of 120 μm, thereby exposing the electrodes. The development was performed with N-methyl-2-pyrolidone. The openings thus formed were filled with the metal paste prepared as above. The filling was performed with an urethane rubber squeegee. The semiconductor chip was then placed on a build-up wiring board. At this time, the openings filled with the metal paste were aligned with the electrodes of the wiring board. Next, the semiconductor chip was heated to a temperature of 260° C. at a rate of 4° C./min, under a load of 20 g. As a result, an electrode-to-electrode bond structure was obtained wherein the semiconductor chip and the wiring board were flip-chip bonded to each other.

Example 2

<Preparation of Resin Film>

An intermediate resin composition was prepared, which contained 67 wt % of solid bisphenol-A epoxy resin (Product Name: AER6042 available from Asahi Kasei Epoxy Corporation) as a main ingredient, 17 wt % of liquid bisphenol-F epoxy resin (Product Name: GY260 available from Hitachi Chemical Co., Ltd.) as another main ingredient, 8 wt % imidazole (Product Name: 2MZ-A available from Shikoku Chemicals Corporation) as a solid hardener, and 8 wt % of polymethyl methacrylate (Product Name: PMMA available from Aldrich Inc.) as an acrylic resin. The intermediate resin composition was mixed with silica powder having an average grain size of 4 μm, at a weight ratio of 1:1 (i.e. the silica powder was mixed at a proportion of 50 wt %), and then formed into a film having a thickness of 50 μm (later used to form a resin coating for Example 2).

<Flip-Chip Bonding>

The resin coating prepared as described above was attached to a semiconductor chip so as to cover its electrodes (electrode diameter: 70 μm, electrode pitch: 150 μm, number of electrodes: 3000), using the roll mounter (available from MCK Co., Ltd.), while heating at 80° C., to form a resin coating. Next, the formation of openings each having a diameter of 80 μm was performed by means of a UV-YAG laser to expose the electrodes. The openings thus formed were filled with the same metal paste as that used for Example 1, using the urethane rubber squeegee. The semiconductor chip was then placed on a build-up wiring board. At this time, the openings filled with the metal paste were aligned with the electrodes of the wiring board. Next, the semiconductor chip was heated to a temperature of 260° C. at a rate of 4° C./min, under a load of 20 g. As a result, an electrode-to-electrode bond structure was obtained wherein the semiconductor chip and the wiring board were flip-chip bonded to each other.

Example 3

<Preparation of Liquid Resin Composition>

An intermediate resin composition was prepared, which contained 41 wt % of solid bisphenol-A epoxy resin (Product Name: AER6042 available from Asahi Kasei Epoxy Corporation) as a main ingredient, 10 wt % of liquid bisphenol-F epoxy resin (Product Name: GY260 available from Hitachi Chemical Co., Ltd.) as another main ingredient, 4.7 wt % of imidazole (Product Name: 2MZ-A available from Shikoku Chemicals Corporation) as a solid hardener, 4.7 wt % of polymethyl methacrylate (Product Name: PMMA available from Aldrich Inc.) as an acrylic resin, 6 wt % of bisphenol-A-diepoxy-acrylic acid adduct (Product Name: V#540 available from Osaka Organic Chemical Industry Ltd.) as an acrylate monomer, 0.6 wt % of 2-benzil-2-dimethylamino-1-(4-morpholinophenyl)-butane-1-on (Product Name: Irgacure369 available from Ciba Specialty Chemicals Inc.) as the photo polymerization initiator, and 33 wt % of methyl ethyl ketone as a solvent. The intermediate resin composition was mixed with silica powder having an average grain size of 4 μm, at a weight ratio of 1:1 (i.e. the silica powder was mixed at a proportion of 50 wt %), thereby providing a liquid resin composition for forming a resin coating.

<Flip-Chip Bonding>

The resin composition prepared as described above was applied to a semiconductor chip to a thickness of 70 μm by means of spin-coating so as to cover its electrodes (electrode diameter: 70 μm, electrode pitch: 150 μm, number of electrodes: 3000). Subsequent drying at a temperature of 80° C. yielded a resin coating of a 50 μm thickness. Next, the resin coating was subjected to exposure and development for forming openings each having a diameter of 120 μm, thereby exposing the electrodes. The development was performed with N-methyl-2-pyrolidone. The openings thus formed were filled with the metal paste prepared as above using a urethane rubber squeegee. The semiconductor chip was then placed on a build-up wiring board. At this time, the openings filled with the metal paste were aligned with the electrodes of the wiring board. Next, the semiconductor chip was heated to a temperature of 260° C. at a rate of 4° C./min, under a load of 20 g. As a result, an electrode-to-electrode bond structure was obtained wherein the semiconductor chip and the wiring board were flip-chip bonded to each other.

Example 4

<Preparation of Metal Paste>

A resin component was prepared, which contained 50 wt % of bisphenol-F epoxy resin (Product Name: GY260 available from Hitachi Chemical Co., Ltd.) as a main ingredient, and 50 wt % methyltetrahydro phthalic anhydride (Product Name: HN-2200 available from Hitachi Chemical Co., Ltd.) as a hardener. The resin component was mixed with a powder of Ag having an average grain size of 7 μm, at a weight ratio of 1:9 (i.e. the Ag powder was added at a proportion of 90 wt %), to obtain a metal paste for Example 4.

<Flip-Chip Bonding>

An electrode-to-electrode bond structure was obtained in the same manner as in Example 1 except that the metal paste prepared as above for Example 4 was used.

Example 5

An electrode-to-electrode bond structure was obtained in the same manner as in Example 2 except that the metal paste prepared as above for Example 4 was used.

Example 6

An electrode-to-electrode bond structure was obtained in the same manner as in Example 3 except that the metal paste prepared as above for Example 4 was used.

Example 7

<Preparation of Metal Paste>

A resin component was prepared, which contained 50 wt % of bisphenol-F epoxy resin (Product Name: GY260 available from Hitachi Chemical Co., Ltd.) as a main ingredient, and 50 wt % of methyltetrahydro phthalic anhydride (Product Name: HN-2200 available from Hitachi Chemical Co., Ltd.) as a hardener. The resin component was mixed with a powder of Sn-52% In having an average grain size of 13 μm, at a weight ratio of 1:9 (i.e. the Sn-52% In was added at a proportion of 90 wt %), to obtain a metal paste for Example 7.

<Flip-Chip Bonding>

An electrode-to-electrode bond structure was obtained in the same manner as in Example 1 except that the metal paste prepared as above for Example 7 was used, and that the heating temperature for bonding was lowered to 230° C. from 260° C.

Example 8

An electrode-to-electrode bond structure was obtained in the same manner as in Example 2 except that the metal paste prepared as above for Example 7 was used, and that the heating temperature for bonding was lowered to 230° C. from 260° C.

Example 9

An electrode-to-electrode bond structure was obtained in the same manner as in Example 3 except that the metal paste prepared as above for Example 7 was used, and that the heating temperature for bonding was lowered to 230° C. from 260° C.

Example 10

<Preparation of Metal Paste>

A flux vehicle was prepared, which contained 53 wt % of polymerised rosin (Product Name: Poly-pale available from Rika-Hercules Inc.), 20 wt % each of 2-methyl-2,4-pentanediol and diethyl glycol monobuthyl ether as a solvent, 2 wt % of succinic acid as an activator, and 5 wt % of hydrogenated castor oil as a thixotropic agent. The flux vehicle was mixed with a powder of Sn-57% Bi-1% Ag having an average grain size of 13 μm, at a weight ratio of 1:9 (i.e. the Sn-57% Bi-1% Ag powder was added at a proportion of 90 wt %), to obtain a metal paste for Example 10.

<Flip-Chip Bonding>

The same resin film as prepared for Example 1 was attached to a semiconductor chip so as to cover its electrodes (electrode diameter: 70 μm, electrode pitch: 150 μm, number of electrodes: 3000), using a roll mounter (available from MCK Co., Ltd.), while heating at 80° C., to form a resin coating. Next, the resin coating was subjected to exposure and development for forming openings each having a diameter of 120 μm, thereby exposing the electrodes. The development was performed with N-methyl-2-pyrolidone. The openings thus formed were filled with the metal paste prepared as above using an urethane rubber squeegee. The semiconductor chip was heated to 170° C., and then cooled, to obtain a semiconductor chip formed with good bumps and the bonding resin coating. This semiconductor chip was then placed on a build-up wiring board. At this time, the openings filled with the metal paste were aligned with the electrodes of the wiring board. Next, the semiconductor chip was heated to a temperature of 260° C. at a rate of 4° C./min under a load of 20 g. As a result, an electrode-to-electrode bond structure was obtained wherein the semiconductor chip and the wiring board were flip-chip bonded to each other.

Example 11

The same resin film as prepared for Example 2 was attached to a semiconductor chip so as to cover its electrodes (electrode diameter: 70 μm, electrode pitch: 150 μm, number of electrodes: 3000), using a roll mounter (available from MCK Co., Ltd.), while heating at 80° C., to form a resin coating. Next, openings each having a diameter of 80 μm were formed in the resin coating by means of a UV-YAG laser to expose the electrodes. The openings thus formed were filled with the same metal paste as used for Example 10, using an urethane rubber squeegee. The semiconductor chip was heated to 170° C., and then cooled, to obtain a semiconductor chip formed with good bumps and the bonding resin coating. This semiconductor chip was then placed on a build-up wiring board. At this time, the openings filled with the metal paste were aligned with the electrodes of the wiring board. Next, the semiconductor chip was heated to a temperature of 260° C. at a rate of 4° C./min under a load of 20 g. As a result, an electrode-to-electrode bond structure was obtained wherein the semiconductor chip and the wiring board were flip-chip bonded to each other.

Example 12

The same resin film as prepared for Example 3 was applied on a semiconductor chip to a thickness of 70 μm by means of spin-coating so as to cover its electrodes (electrode diameter: 70 μm, electrode pitch: 150 μm, number of electrodes: 3000). Subsequent drying at a temperature of 80° C. yielded a resin coating of a 50 μm thickness. Next, the resin coating was subjected to exposure and development for forming openings each having a diameter of 120 μm to expose the electrodes. The development was performed with N-methyl-2-pyrolidone. The openings thus formed were filled with the same metal paste as prepared for Example 10, using an urethane rubber squeegee. The semiconductor chip was heated to 170° C., and then cooled, to-obtain a semiconductor chip formed with good bumps and the bonding resin coating. This semiconductor chip was then placed on a build-up wiring board. At this time, the openings filled with the metal paste were aligned with the electrodes of the wiring board. Next, the semiconductor chip was heated to a temperature of 260° C. at a rate of 4° C./min under a load of 30 g. As a result, an electrode-to-electrode bond structure was obtained wherein the semiconductor chip and the wiring board were flip-chip bonded to each other.

Example 13

<Preparation of Resin Film>

An intermediate resin composition was prepared, which contained 66 wt % of solid bisphenol-A epoxy resin (Product Name: AER6042 available from Asahi Kasei Epoxy Corporation) as a main ingredient, 13 wt % of liquid bisphenol-F epoxy resin (Product Name: 830LVP available from Dainippon Ink And Chemicals, Incorporated) as another main ingredient, 13 wt % of pentaerythritol triacrylate (Product Name: TMP-3A available from Osaka Organic Chemical Industry Ltd.) as a photosensitive agent, 1 wt % of 2-benzil-2-dimethylamino-1-(4-morpholinophenyl)-butane-1-on (Product Name: Irgacure369 available from Ciba Specialty Chemicals Inc.) as a photo polymerization initiator, and 7 wt % of polyester resin as a thermoplastic resin. The intermediate resin composition was mixed with silica powder having an average grain size of 4 μm, at a weight ratio of 3:7 (i.e. the silica powder was mixed at a proportion of 70 wt %), and then formed into a film having a thickness of 50 μm (later used for forming a resin coating for Example 13).

<Preparation of Metal Paste>

A resin component was prepared, which contained 96 wt % of methyltetrahydro phthalic anhydride (Product Name: HN-2200 available from Hitachi Chemical Co., Ltd.) as a hardener, and 4 wt % of 1-methyl-2-ethyl imidazole (Product Name: IM2EZ available from Shikoku Chemicals Corporation) as a hardening promoter. The resin component was mixed with a powder of Sn-3.5% Ag having an average grain size of 13 μm, at a weight ratio of 1:9 (i.e. the Sn-3.5% Ag was added at a proportion of 90 wt %), to obtain a metal paste for Example 13.

<Flip-Chip Bonding>

The resin film prepared as described above was attached to an LSI chip wafer (corresponding to a plurality of chips each having 3000 electrodes) so as to cover the electrodes (electrode diameter: 70 μm, electrode pitch: 150 μm), using a laminating machine (available from MCK Co., Ltd.), while heating at 65° C., to form a resin coating. Next, the resin coating was subjected to exposure and development for forming openings each having a diameter of 120 μm, thereby exposing the electrodes. The development was performed with isopropyl alcohol. The openings thus formed were filled with the metal paste prepared as above, using a urethane rubber squeegee. A protective film (Product Name: D628 available from Lintec Co., Ltd.) was pasted to a surface of the resin coating. The LSI chip wafer was diced into individual chips. The diced chip was preliminarily mounted on a build-up wiring board, using a flip-chip bonder. During this mounting, the openings filled with the metal paste were aligned with the electrodes of the wiring board. The semiconductor chip was heated to 170° C., and then cooled, to obtain a semiconductor chip formed with good bumps and the bonding resin coating. Next, the semiconductor chip was heated to a temperature of 260° C. at a rate of 4° C./min under a load of 20 g. As a result, an electrode-to-electrode bond structure was obtained wherein the semiconductor chip and the wiring board were flip-chip bonded to each other.

Example 14

<Preparation of Resin Film>

An intermediate resin composition was prepared, which contained 73 wt % of solid bisphenol-A epoxy resin (Product Name: AER6042 available from Asahi Kasei Epoxy Corporation) as a main ingredient, 18 wt % of liquid bisphenol-F epoxy resin (Product Name: 830LVP available from Dainippon Ink And Chemicals, Incorporated) as another main ingredient, and 9 wt % of polyester resin as a thermoplastic resin. The intermediate resin composition was mixed with silica powder having an average grain size of 4 μm, at a weight ratio of 3:7 (i.e. the silica powder was mixed at a proportion of 70 wt %), and then formed into a film having a thickness of 50 μm (later used for forming a resin coating for Example 14).

<Preparation of Metal Paste>

A resin component was prepared, which contained 69 wt % of methyltetrahydro phthalic anhydride (Product Name: HN-2200 available from Hitachi Chemical Co., Ltd.) as a hardener, 3 wt % of 1-methyl-2-ethyl imidazole (Product Name: IM2EZ available from Shikoku Chemicals Corporation) as a hardening promoter, and 28 wt % of tetraethyleneglycol as a solvent. The resin component was mixed with a powder of Sn-3.5% Ag having an average grain size of 13 μm, at a weight ratio of 1:9 (i.e. the Sn-3.5% Ag was added at a proportion of 90 wt %), to obtain a metal paste for Example 14.

<Flip-Chip Bonding>

The resin film prepared as described above was attached to a build-up wiring board A to cover its electrodes (electrode diameter: 70 μm, electrode pitch: 150 μm), using a laminating machine (available from MCK Co., Ltd.), while heating at 65° C., to form a resin coating. Next, openings each having a diameter of 120 μm were formed in the resin coating by means of $CO_2$ laser, thereby exposing the electrodes. The openings thus formed were filled with the metal paste prepared as above, using an urethane rubber squeegee. The build-up wiring board A was then placed on another build-up wiring board B for provisional mounting. At this time, the openings filled with the metal paste were aligned with the electrodes of the build-up wiring board B using a flip-chip bonder. Next, the wiring board A was heated to a temperature of 260° C. at a rate of 4° C./min under a load of 20 g. As a result, an electrode-to-electrode bond structure was obtained wherein the two wiring boards A and B were bonded to each other.

Example 15

<Preparation of Liquid Resin Composition>

An intermediate resin composition was prepared, which contained 66 wt % of liquid bisphenol-F epoxy resin (Product Name: 830LVP available from Dainippon Ink And Chemicals, Incorporated) as a main ingredient, 26 wt % of pentaerythritol triacrylate (Product Name: TMP-3A available from Osaka Organic Chemical Industry Ltd.) as a-photosensitive agent, 1 wt % of 2-benzil-2-dimethylamino-1-(4-morpholinophenyl)-butane-1-on (Product Name: Irgacure369 available from Ciba Specialty Chemicals Inc.) as a photopolymerization initiator, and 7 wt % of polyester resin as a thermoplastic resin. The intermediate resin composition was mixed with silica powder having an average grain size of 4 μm, at a weight ratio of 3:7 (i.e. the silica powder was mixed at a proportion of 70 wt %), to obtain a liquid resin composition for forming a resin coating.

<Preparation of Metal Paste>

A resin component was prepared, which contained a phenol hardener (Product Name: BUR601P available from Asahi Denka Kogyo K.K.), 4 wt % of 1-methyl-2-ethyl imidazole (Product Name: IM2EZ available from Shikoku Chemicals Corporation) as a hardening promoter, 7 wt % of succinic acid anhydride as an activator, 4 wt % of rosin acid (available from Wako Pure Chemical Ltd.), and 14 wt % of tetraethylene glycol as a solvent. The resin component was mixed with a powder of Sn-3.5% Ag having an average grain size of 13 μm, at a weight ratio of 1:9 (i.e. the Sn-3.5% Ag was added at a proportion of 90 wt %), to obtain a metal paste for Example 15.

<Flip-Chip Bonding>

The liquid resin composition prepared as described above was applied, by means of spin coating using a spin-coater, onto an LSI chip wafer (corresponding to a plurality of chips each having 3000 electrodes) so as to cover the electrodes (electrode diameter: 70 μm, electrode pitch: 150 μm), to form a resin coating. Then, the same process steps as in Example 13 were followed to obtain an electrode-to-electrode bond structure wherein a semiconductor chip and a wiring board were bonded to each other by flip-chip bonding.

Example 16

<Preparation of Resin Film>

An intermediate resin composition was prepared, which contained 75 wt % of phenol hardener (Product Name: BUR601P available from Asahi Denka Kogyo K.K.), 16 wt % of pentaerythritol triacrylate (Product Name: TMP-3A available from Osaka Organic Chemical Industry Ltd.) as a photosensitive agent, 1 wt % of 2-benzil-2-dimethylamino-1-(4-morpholinophenyl)-butane-1-on (Product Name: Irgacure369 available from Ciba Specialty Chemicals Inc.) as a photo polymerization initiator, and 8 wt % of polyester resin as a thermoplastic resin. The intermediate resin composition was mixed with silica powder having an average grain size of 4 μm, at a weight ratio of 3:7 (i.e. the silica powder was mixed at a proportion of 70 wt %), and then formed into a film having a thickness of 50 μm (later used for forming a resin coating for Example 16).

<Preparation of Metal Paste>

A resin component was prepared, which contained 83 wt % of liquid bisphenol-F epoxy resin (Product Name: 830LVP available from Dainippon Ink And Chemicals, Incorporated) as a main ingredient, and 17 wt % of tetra ethylene glycol as a solvent. The resin component was mixed with a powder of Sn-3.5% Ag having an average grain size of 13 μm, at a weight ratio of 1:9 (i.e. the Sn-3.5% Ag was added at a proportion of 90 wt %), to obtain a metal paste for Example 16.

<Flip-Chip Bonding>

The same process steps as in Example 13 were followed, except that the resin coating and the metal paste prepared for Example 16 were used, to obtain an electrode-to-electrode bond structure wherein a semiconductor chip and a wiring board were bonded to each other by flip-chip bonding.

Example 17

<Preparation of Resin Film>

A resin film for Example 17 was prepared in the same manner as in Example 1 except that the film thickness was decreased to 20 μm from 50 μm.

<Flip-Chip Bonding>

The resin film thus prepared was attached to a semiconductor chip so as to cover its electrodes (electrode diameter: 40 μm, electrode pitch: 80 μm, number of electrodes: 3000), using a roll mounter (available from MCK Co., Ltd.), while heating at 80° C., to form a resin coating. Next, the resin coating was subjected to exposure and development for forming openings each having a diameter of 40 μm, thereby exposing the electrodes. The development was performed with N-methyl-2-pyrolidone.

Then, an electroplating terminal layer was formed over the resin coating and over the electrodes in the openings. Specifically, Ti was first sputtered to a thickness of 0.5 μm, followed by sputtering Ni to a thickness of 0.5 μm.

Then, a plating resist layer was formed over the resin coating (previously provided with the electroplating terminal layer) and patterned to have openings aligned with the openings of the coating layer.

Then, conductors were formed within the openings of the resin coating by electroplating. Specifically, each of the electrodes covered with the electroplating terminal layer within the opening was first plated with Ni to a thickness of 4 μm, followed by plating with Sn to a thickness of 15 μm.

Then, the plating resist layer and the portions of the electroplating terminal layer remaining over the resin coating were successively removed. As a result, the bonding resin coating and the conductors each having a two-layer structure (the Ni layer and the Sn layer) remained on the semiconductor chip.

Then, the semiconductor chip was then placed on a build-up wiring board. At this time, the conductors formed in the openings were aligned with the electrodes of the wiring board in surface-to-surface contact. Finally, the semiconductor chip was heated to a temperature of 260° C. at a rate of 4° C./min under a load of 20 g. As a result, an electrode-to-electrode bond structure was obtained wherein the semiconductor chip and the wiring board were flip-chip bonded to each other.

Example 18

<Preparation of Resin Film>

A resin film for Example 18 was prepared in the same manner as in Example 2 except that the film thickness was decreased to 20 μm from 50 μm.

<Flip-Chip Bonding>

The resin film thus prepared was attached to a semiconductor chip so as to cover its electrodes (electrode diameter: 40 μm, electrode pitch: 80 μm, number of electrodes: 3000), using a roll mounter (available from MCK Co., Ltd.), while heating at 80° C., to form a resin coating. Next, openings each having a diameter of 40 μm were formed in the resin coating with the use of a UV-YAG laser to expose the electrodes. Subsequently, the same process steps as in Example 17 were performed to provide an electrode-to-electrode bond structure wherein the semiconductor chip is flip-chip bonded to a wiring board.

Example 19

<Preparation of Liquid Resin Composition>

A liquid resin composition was prepared in the same manner as in Example 3 except that the weight ratio between the resin and the silica powder was changed to 5:1 (16.7 wt % of silica) from 1:1.

<Flip-Chip Bonding>

The resin composition prepared for Example 19 was applied to a semiconductor chip to a thickness of 70 μm by means of spin-coating so as to cover its electrodes (electrode diameter: 40 μm, electrode pitch: 80 μm, number of electrodes: 3000). Subsequent drying at a temperature of 80° C. yielded a resin coating of a 20 μm thickness. Next, the resin coating was subjected to exposure and development for forming openings each having a diameter of 40 μm, thereby exposing the electrodes. The development was performed with N-methyl-2-pyrolidone. Subsequently, the same process steps as in Example 17 were performed to provide an electrode-to-electrode bond structure wherein the semiconductor chip is flip-chip bonded to a wiring board.

Example 20

The same process steps as in Example 17 were performed to provide an electrode-to-electrode bond structure wherein a semiconductor chip is flip-chip bonded to a wiring board, except that a 63% Sn—Pb layer of 15 μm thickness was formed by electroplating instead of a 15 μm thick Sn layer.

Thus, each of the conductors connecting between an electrode of the semiconductor chip and a counterpart electrode of the wiring board had a two-layer structure consisting of a Ni layer and a 63% Sn—Pb layer in Example 20.

Example 21

The same process steps as in Example 18 were performed to provide an electrode-to-electrode bond structure wherein a semiconductor chip is flip-chip bonded to a wiring board, except that a 63% Sn—Pb layer of 15 µm thickness was formed by electroplating instead of a 15 µm thick Sn layer. Thus, each of the conductors connecting between an electrode of the semiconductor chip and a counterpart electrode of the wiring board had a two-layer structure consisting of a Ni layer and a 63% Sn—Pb layer in Example 21, as in Example 20.

Example 22

The same process steps as in Example 19 were performed to provide an electrode-to-electrode bond structure wherein a semiconductor chip is flip-chip bonded to a wiring board, except that a 63% Sn—Pb layer of 15 µm thickness was formed by electroplating instead of a 15 µm thick Sn layer. Thus, each of the conductors connecting between an electrode of the semiconductor chip and a counterpart electrode of the wiring board had a two-layer structure consisting of a Ni layer and a 63% Sn—Pb layer in Example 22, as in Examples 20 and 21.

Example 23

The same resin film as used in Example 17 was attached to a semiconductor chip so as to cover its electrodes (electrode diameter: 40 µm, electrode pitch: 80 µm, number of electrodes: 3000), using a roll mounter (available from MCK Co., Ltd.), while heating at 80° C., to form a resin coating. Next, the resin coating was subjected to exposure and development for forming openings each having a diameter of 40 µm, thereby exposing the electrodes. The development was performed with N-methyl-2-pyrolidone.

Then, an electroplating terminal layer was formed over the resin coating and over the electrodes in the openings. Specifically, Ti was first sputtered to a thickness of 0.5 µm, followed by sputtering Ni to a thickness of 0.5 µm.

Then, a plating resist layer was formed over the resin coating (previously provided with the electroplating terminal layer) and patterned to have openings aligned with the openings of the coating layer.

Then, conductors were formed within the openings of the resin coating by electroplating. Specifically, each of the electrodes covered with the electroplating terminal layer within the opening was first plated with Ni to a thickness of 4 µm, followed by plating with In to a thickness of 15 µm.

Then, the plating resist layer and the portions of the electroplating terminal layer remaining over the resin coating were successively removed. As a result, the bonding resin coating and the conductors each having a two-layer structure (the Ni layer and the In layer) remained on the semiconductor chip.

Then, the semiconductor chip was then placed on a build-up wiring board. At this time, the conductors formed in the openings were aligned with the electrodes of the wiring board in surface-to-surface contact. Finally, the semiconductor chip was heated to a temperature of 180° C. at a rate of 4° C./min under a load of 20 g and held at this temperature for ten minutes. As a result, an electrode-to-electrode bond structure was obtained wherein the semiconductor chip and the wiring board were flip-chip bonded to each other.

Example 24

The same resin film as used in Example 18 was attached to a semiconductor chip so as to cover its electrodes (electrode diameter: 40 µm, electrode pitch: 80 µm, number of electrodes: 3000), using a roll mounter (available from MCK Co., Ltd.), while heating at 80° C., to form a resin coating. Next, openings each having a diameter of 40 µm were formed in the resin coating with the use of a UV-YAG laser to expose the electrodes. Subsequently, the same process steps as in Example 23 were performed to provide an electrode-to-electrode bond structure wherein the semiconductor chip is flip-chip bonded to a wiring board. In Example 24, each of the conductors had a two-layer structure consisting of a Ni layer and an In layer, as in Example 23.

Example 25

The same resin composition as used in Example 19 was applied to a semiconductor chip to a thickness of 70 µm by means of spin-coating so as to cover its electrodes (electrode diameter: 40 µm, electrode pitch: 80 µm, number of electrodes: 3000). Subsequent drying at a temperature of 80° C. yielded a resin coating of a 20 µm thickness. Next, the resin coating was subjected to exposure and development for forming openings each having a diameter of 40 µm, thereby exposing the electrodes. The development was performed with N-methyl-2-pyrolidone. Subsequently, the same process steps as in Example 23 were performed to provide an electrode-to-electrode bond structure wherein the semiconductor chip is flip-chip bonded to a wiring board. In Example 25, each of the conductors had a two-layer structure consisting of a Ni layer and an In layer, as in Examples 23 and 24.

Example 26

The same process steps as in Example 23 were performed to provide an electrode-to-electrode bond structure wherein a semiconductor chip is flip-chip bonded to a wiring board, except that a Sn-57% Bi layer of 15 µm thickness was formed by electroplating instead of a 15 µm thick In layer. Thus, each of the conductors connecting between an electrode of the semiconductor chip and a counterpart electrode of the wiring board had a two-layer structure consisting of a Ni layer and a Sn-57% Bi layer in Example 26.

Example 27

The same process steps as in Example 24 were performed to provide an electrode-to-electrode bond structure wherein a semiconductor chip is flip-chip bonded to a wiring board, except that a Sn-57% Bi layer of 15 µm thickness was formed by electroplating instead of a 15 µm thick In layer. Thus, each of the conductors connecting between an electrode of the semiconductor chip and a counterpart electrode of the wiring board had a two-layer structure consisting of a Ni layer and a Sn-57% Bi layer in Example 27, as was also the case with Example 26.

Example 28

The same process steps as in Example 25 were performed to provide an electrode-to-electrode bond structure wherein a semiconductor chip is flip-chip bonded to a wiring board, except that a Sn-57% Bi layer of 15 μm thickness was formed by electroplating instead of a 15 μm thick In layer. Thus, each of the conductors connecting between an electrode of the semiconductor chip and a counterpart electrode of the wiring board had a two-layer structure consisting of a Ni layer and a Sn-57% Bi layer in Example 28, as was also the case with Examples 26 and 27.

Example 29

The same resin film as used in Example 17 was attached to a semiconductor chip so as to cover its electrodes (electrode diameter: 40 μm, electrode pitch: 80 μm, number of electrodes: 3000), using a roll mounter (available from MCK Co., Ltd.), while heating at 80° C., to form a resin coating. Next, the resin coating was subjected to exposure and development for forming openings each having a diameter of 40 μm, thereby exposing the electrodes. The development was performed with N-methyl-2-pyrolidone.

Then, a catalyst was applied onto the electrodes in the openings of the resin coating.

Then, conductors were formed within the openings of the resin coating by electroless plating. Specifically, each of the electrodes was first plated with Cu to a thickness of 17 μm, followed by plating with Sn to a thickness of 3 μm. As a result, the conductor had a two-layer structure consisting of the Cu layer and the Sn layer.

Then, the semiconductor chip was then placed on a build-up wiring board. At this time, the conductors formed in the openings were aligned with the electrodes of the wiring board in surface-to-surface contact. Finally, the semiconductor chip was heated to a temperature of 260° C. at a rate of 4° C./min under a load of 20 g. As a result, an electrode-to-electrode bond structure was obtained wherein the semiconductor chip and the wiring board were flip-chip bonded to each other.

Example 30

The same resin film as used in Example 18 was attached to a semiconductor chip so as to cover its electrodes (electrode diameter: 40 μm, electrode pitch: 80 μm, number of electrodes: 3000), using a roll mounter (available from MCK Co., Ltd.), while heating at 80° C., to form a resin coating. Next, openings each having a diameter of 40 μm were formed in the resin coating with the use of a UV-YAG laser to expose the electrodes. Subsequently, the same process steps as in Example 29 were performed to provide an electrode-to-electrode bond structure wherein the semiconductor chip is flip-chip bonded to a wiring board. In Example 30, each of the conductors had a two-layer structure consisting of a Cu layer and an Sn layer, as in Example 29.

Example 31

The same resin composition as used in Example 19 was applied to a semiconductor chip to a thickness of 70 μm by means of spin-coating so as to cover its electrodes (electrode diameter: 40 μm, electrode pitch: 80 μm, number of electrodes: 3000). Subsequent drying at a temperature of 80° C. yielded a resin coating of a 20 μm thickness. Next, the resin coating was subjected to exposure and development for forming openings each having a diameter of 40 μm, thereby exposing the electrodes. The development was performed with N-methyl-2-pyrolidone. Subsequently, the same process steps as in Example 29 were performed to provide an electrode-to-electrode bond structure wherein the semiconductor chip is flip-chip bonded to a wiring board. In Example 31, each of the conductors had a two-layer structure consisting of a Cu layer and an Sn layer, as in Examples 29 and 30.

[Temperature Cycle Test]

In each of Examples 1 through 31, the electrode-to-electrode bond structure was subjected to a temperature cycle test to check for its connection reliability. Specifically, first, the initial electric resistance was measured for each of the electrode-to-electrode connections. Next, the electrode-to-electrode bond structure was repetitively subjected to a temperature cycle ranging from −55° C. to 125° C., and then the electric resistance was measured again for each electrode-to-electrode connection. The temperature cycle included cooling at −55° C. for 15 minutes, followed by leaving at room temperatures for 10 minutes and then heating at 125° C. for 15 minutes, and this cycle was repeated 2000 times. As a result, it was found that a resistance increase at each connection was less than 10%, confirming that good connections had been formed.

[Humidity Test]

In each of Examples 1 through 31, the electrode-to-electrode bond structure was subjected to a humidity test to check for its connection reliability. Specifically, first, the initial electric resistance was measured for each of the electrode-to-electrode connections at a temperature of 25° C. and a relative humidity of 60%. Next, the electrode-to-electrode bond structure was left for 1,000 hours at a temperature of 121° C. and a relative humidity of 85% humidity, and then the electric resistance was measured again for each electrode-to-electrode connection. As a result, it was found that a resistance increase at each connection was less than 10%, confirming that good connections had been formed.

Comparative Example

Conventional flip-chip bonding was performed, following the process steps described earlier with reference to FIGS. 6a through 6j. First, bumps were formed on a semiconductor chip (electrode diameter: 70 μm, electrode pitch: 150 μm, number of electrodes: 3000), using a metal mask having a thickness of 50 μm and formed with openings each having a diameter of 120 μm. The openings were filled with a metal paste. The metal paste was a mixture of a flux vehicle and a metal powder. The flux vehicle contained 53 wt % of Poly-pale (available from Rika-Hercules Inc.) as rosin, 20 wt % each of 2-methyl-2,4-pentanediol and diethyleneglycol monobuthylether as a solvent, 2 wt % of succinic acid as an activator, and 5 wt % of hydrogenated castor oil as a thixotropic agent. The metal powder was a powder of Sn-3.5% Ag having an average grain size of 13 μm. The mixture ratio between the flux vehicle and the metal paste was 1:9 (i.e. 90 wt % of Sn-3.5% Ag powder).

After filling the metal paste, the metal mask was removed, and the metal paste was heated at a temperature of 260° C. to form the bumps on the electrodes. Next, a flux was applied on a wiring board. Then, the semiconductor chip formed with the bumps was placed on the wiring board in alignment, followed by additional heating at 260° C. Then, a glycol ether cleaner (Product Name: Clean Through available from Kao Corporation) was used to remove the flux from a gap between the semiconductor chip and the wiring board. Then, a liquid under-fill resin was filled in the gap. The under-fill resin contained 42 wt % of bisphenol-F epoxy resin (Product Name: GY260 available from Hitachi Chemical Co., Ltd.) as q main ingredient, 36 wt % of methyltetrahydro phthalic anhydride (Product Name: HN-2200 available from Hitachi Chemical Co., Ltd.) as a hardener, 1 wt % of 1-cyanoethyl-2-ethyl-4-methyl imidazole (Product Name: 2E4MZ-CN available from Shikoku Chemicals Corporation) as a catalyst, and 21 wt % of silica powder having an average grain size of 4 µm. After filling, the under-fill resin was allowed to harden at 150° C. for two hours.

As was done for Examples 1 through 31, the electrode-to-electrode bond structure formed as above was subjected to the temperature cycle test. It was found that a resistance increase at each connection was 20% or more. Also, the humidity test was performed, as was done for Examples 1 through 31. It was found that a resistance increase at each connection was 20% or more.

What is claimed is:

1. An electrode-to-electrode bond structure comprising:
   a first bonding object having a first electrode portion;
   a second bonding object having a second electrode portion facing the first electrode portion;
   an electric conductor having an intermediate constricted portion for connecting the first electrode portion and the second electrode portion, the electric conductor also having a boundary surface for direct bonding contact with each of the first and second bonding objects; and
   a sealing resin sealing a gap between the first bonding object and the second bonding object,
   wherein the electric conductor is dimensionally largest at the boundary surface between the electric conductor and one or each of the first and second bonding objects, the electric conductor progressively decreasing in dimension from the boundary surface toward the intermediate constricted portion.

2. The electrode-to-electrode bond structure according to claim 1, wherein the sealing resin contains an inorganic filler at a proportion of 30–70 wt %.

3. The electrode-to-electrode bond structure according to claim 1, wherein each of the first bonding and the second bonding object is either a semiconductor chip or a wiring board.

* * * * *